United States Patent
Bezugly et al.

(10) Patent No.: US 11,649,167 B2
(45) Date of Patent: May 16, 2023

(54) METHOD FOR GROWING VERTICALLY ORIENTED SINGLE-WALLED CARBON NANOTUBES WITH THE SAME ELECTRONIC PROPERTIES AND FOR REPRODUCING SINGLE-WALLED CARBON NANOTUBES WITH THE SAME ELECTRONIC PROPERTIES

(71) Applicant: TECHNISCHE UNIVERSITAET DRESDEN, Dresden (DE)

(72) Inventors: Viktor Bezugly, Dresden (DE);
Eugenia Bezugly, Dresden (DE);
Vyacheslav Khavrus, Dresden (DE);
Denis Krylov, Dresden (DE);
Gianaurelio Cuniberti, Dresden (DE)

(73) Assignee: SMARTNANOTUBES TECHNOLOGIES GMBH, Freital (DE)

( * ) Notice: Subject to any disclaimer, the term of this patent is extended or adjusted under 35 U.S.C. 154(b) by 321 days.

(21) Appl. No.: 15/321,861

(22) PCT Filed: Jun. 24, 2015

(86) PCT No.: PCT/EP2015/064311
§ 371 (c)(1),
(2) Date: Dec. 23, 2016

(87) PCT Pub. No.: WO2015/197729
PCT Pub. Date: Dec. 30, 2015

(65) Prior Publication Data
US 2017/0137935 A1 May 18, 2017

(30) Foreign Application Priority Data
Jun. 24, 2014 (DE) ...................... 10 2014 212 077.2

(51) Int. Cl.
*B32B 9/00* (2006.01)
*C01B 32/159* (2017.01)
(Continued)

(52) U.S. Cl.
CPC .......... *C01B 32/159* (2017.08); *C01B 32/174* (2017.08); *C23C 16/26* (2013.01);
(Continued)

(58) Field of Classification Search
CPC ...... Y10T 428/30; C01B 31/022–0293; C01B 2202/02; H01B 4/01; B82Y 30/00
(Continued)

(56) References Cited

U.S. PATENT DOCUMENTS 7,022,541 B1 * 4/2006 Yenilmez ............... B82Y 35/00
438/52
7,612,424 B1 * 11/2009 Espinosa ............... B81B 3/0054
200/181
(Continued)

FOREIGN PATENT DOCUMENTS

JP 2000057934 2/2000
JP 2004083293 3/2004
(Continued)

OTHER PUBLICATIONS

X. Nan et al., "Immobilizing Shortened Single-Walled Carbon Nanotubes on Gold Using a Surface Condensation Method", J. Colloid & Interface Science, 245, pp. 311-318 (2002).
(Continued)

*Primary Examiner* — Daniel H Miller
(74) *Attorney, Agent, or Firm* — Jacobson Holman PLLC

(57) ABSTRACT

The present invention relates to a method of reproducing at least one single-walled carbon nanotube (3) having pre-defined electronic properties or a plurality of single-walled carbon nanotube (3) having the same electronic properties.
(Continued)

Figure 1:
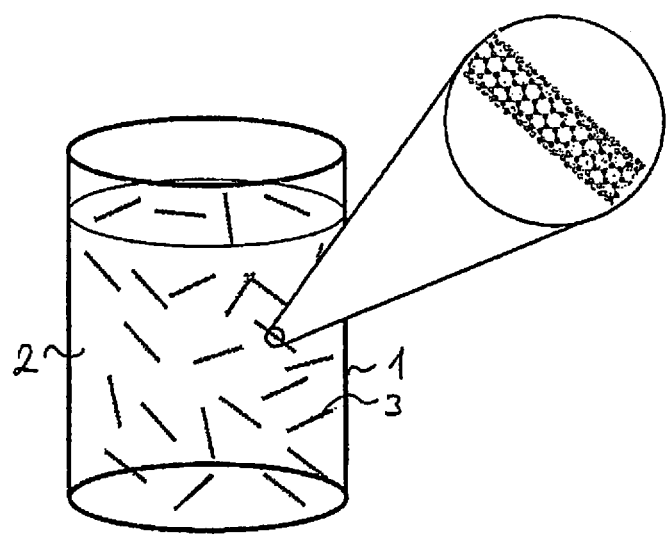

A dispersion (2) is produced for this purpose and carbon nanotubes (3) contained in the dispersion are processed into fragments (6) by energy input. These fragments (6) are applied to and oriented on a carrier (7). The fragments (6) are subsequently extended by chemical vapor deposition and the originally present carbon nanotubes (3) are thus reproduced.

15 Claims, 5 Drawing Sheets

(51) Int. Cl.
    *C01B 32/174*    (2017.01)
    *C23C 16/26*     (2006.01)
    *C23C 16/455*    (2006.01)
    *C23C 16/50*     (2006.01)
    *B82Y 30/00*     (2011.01)
    *B82Y 40/00*     (2011.01)

(52) U.S. Cl.
    CPC ............ *C23C 16/455* (2013.01); *C23C 16/50* (2013.01); *B82Y 30/00* (2013.01); *B82Y 40/00* (2013.01); *C01B 2202/02* (2013.01); *C01B 2202/08* (2013.01); *C01B 2202/22* (2013.01); *C01B 2202/36* (2013.01); *Y10S 977/751* (2013.01); *Y10S 977/842* (2013.01); *Y10S 977/932* (2013.01); *Y10T 428/30* (2015.01)

(58) Field of Classification Search
    USPC .......................... 428/408; 423/448; 252/501
    See application file for complete search history.

(56) References Cited

U.S. PATENT DOCUMENTS

| | | | |
|---|---|---|---|
| 2004/0142285 A1* | 7/2004 | Jung | B82Y 10/00 430/315 |
| 2006/0276099 A1* | 12/2006 | Vink | B82Y 10/00 445/35 |
| 2009/0060827 A1 | 3/2009 | Vinelguerra et al. | |
| 2012/0263951 A1* | 10/2012 | Mueller | H01B 1/04 428/364 |

FOREIGN PATENT DOCUMENTS

| | | |
|---|---|---|
| JP | 2013086975 | 5/2013 |
| WO | WO 2005/085132 A2 | 9/2005 |
| WO | WO 2006/117196 A2 | 11/2006 |
| WO | WO 2010/036396 A1 | 4/2010 |

OTHER PUBLICATIONS

E. Joselevich et al., "Carbon Nanotube Synthesis & Organization", Carbon Nanotubes, Topics Appl. Physics, 111, pp. 101-164 (2008).
F. Lamberti et al., "Nanotubes Oxidation Temperature Controls the Height of Single-Walled Carbon Nanotube FOrests on Gold Micropatterned Thin Layers", Langmuir, 26, # 13, 2010.

* cited by examiner

METHOD FOR GROWING VERTICALLY ORIENTED SINGLE-WALLED CARBON NANOTUBES WITH THE SAME ELECTRONIC PROPERTIES AND FOR REPRODUCING SINGLE-WALLED CARBON NANOTUBES WITH THE SAME ELECTRONIC PROPERTIES

The present invention relates to a method for growing vertically oriented single-walled carbon nanotubes having the same electronic properties and for reproducing single-walled carbon nanotubes having the same electronic properties.

Carbon nanotubes are promising candidates for future technical applications due to their special properties. Carbon nanotubes can thus be metallic or semiconductive in dependence on their diameter and their helicity and/or their chirality. Manufacturing methods from the prior art, however, result in a mixture of carbon nanotubes of different types, that is multi-walled, single-walled metallic and semiconductive carbon nanotubes that subsequently have to be laboriously separated from one another. It is thus not yet possible to directly fix the diameter and the chirality of the manufactured carbon nanotubes during the manufacture.

Single-walled carbon nanotubes have previously been obtained by arc discharge, laser ablation and catalyst-assisted decomposition of hydrocarbons by chemical vapor deposition (CVD). It is, however, common to these methods that a control of the electronic properties or of the diameter and of the chirality cannot be carried out during a manufacturing process.

It is therefore the underlying object of the present invention to develop a method of reproducing carbon nanotubes and to develop corresponding carbon nanotubes with which the named disadvantages can be avoided, that is, with which carbon nanotubes having the same electronic properties can be manufactured.

This object is achieved in accordance with the invention by a method and by a carrier having carbon nanotubes arranged thereon in accordance with the claims set forth herein.

A method of reproducing at least one single-walled carbon nanotube or a plurality of single-walled carbon nanotubes having the same electronic properties comprises a plurality of steps. First, a dispersion of a liquid and the at least one single-walled carbon nanotube or the plurality of single-walled carbon nanotubes that have the same electronic properties is prepared. Fragments of the at least one single-walled carbon nanotube or of the plurality of single-walled nanotubes are formed by an energy input into the dispersion, that is these carbon nanotubes are fragmented. The produced fragments are applied from the dispersion onto a surface of a carrier and serve as a start layer for the reproduction after the application. At the same time as this, that is during the application from the dispersion, in particular as long as the dispersion is in its liquid phase and has not yet dried, the fragments on the surface are oriented such that the surface is intersected by a longitudinal axis of the fragments and the fragments are not oriented in parallel in a plane with respect to the carrier or more precisely with the named surface of the carrier. The carrier with the fragments applied and oriented thereon is subsequently introduced into an apparatus for chemical vapor deposition. Single-walled carbon nanotubes having the same electronic properties are grown by chemical vapor deposition in the apparatus for chemical vapor deposition, starting from the fragments serving as a start layer, in a gas atmosphere containing carbon in that the fragments are extended.

Carbon nanotubes having defined, preset properties can be produced by the described method and a subsequent sorting is dispensed with. Since a homogeneous plurality of carbon nanotubes are already used and since they are reproduced, carbon nanotubes having the same electronic properties, and preferably having the same optical properties, are produced. The one single-walled carbon nanotube or the plurality of single-walled carbon nanotubes that is/are used as the starting material for the method can in this respect be both metallic and semiconductive. Due to the orientation on the surface, the carbon nanotube can be simply extended in one direction without obstructing one another so that single-walled carbon nanotubes that are ideally arranged vertically to the surface and in parallel with one another form on the carrier and a high packing density of carbon nanotubes per unit of area results. Since this orientation on the surface takes place simultaneously with the application, the method can be carried out more efficiently and a density of the arrangement of carbon nanotubes on the substrate is increased. The longitudinal axis of one of the fragments should in this respect designate the axis about which the respective fragment of the carbon nanotubes is rotationally symmetrically arranged. The method additionally has the advantage that typically no catalysts are used as in conventional manufacturing methods and the carbon nanotubes are thus present in particularly pure form; however, provision can naturally also be made to use catalysts in the chemical vapor deposition. The longitudinal axes of the carbon nanotubes are typically at an angle different from 0° with respect to a plane disposed in parallel with the surface of the carrier after the carrying out of the method.

The carbon nanotubes with which the method can be started can also only comprise a specific percentage, typically 80%, preferably 90%, and particularly preferably 99%, of single-walled nanotubes having the same electronic properties, that is, being metallic or semiconductive and/or having the same respective diameter and/or the same respective chirality. It is better to carry out the method at a higher proportion of carbon nanotubes having the same properties; however a small portion of carbon nanotubes having at least one differing property can be tolerated. The carbon nanotubes having the same properties that serves as the starting material of the method have typically been manufactured using methods known from the prior art and have been sorted with respect to their properties by known separation processes, e.g. ultracentrifugation, chromatography or by processes based on gels or polymers.

Provision can be made that the fragments are formed in the dispersion by an introduction of ultrasound. Ultrasound provides a reliable division or cutting or breaking open of the carbon nanotubes into individual fractions or fragments. The fragments preferably have a length between 30 nm and 100 nm. This allows a large aspect ratio, i.e. that a length is typically larger than a diameter of one of the carbon nanotubes. Single-walled carbon nanotubes usually have a diameter between 0.6 nm and 2 nm. The ultrasound is typically used at a power between 30 W and 100 W and at a frequency between 20 kHz and 40 kHz.

The fragments can be oriented by applying an electrical field on the surface of the carrier. This allows a vertical orientation in a particularly simple manner in which the forming carbon nanotubes grow directed away from the surface. Field lines of the electrical field preferably have an angle with respect to the surface of the carrier between 80° and 100° for this purpose to ensure a vertical orientation.

The carbon nanotubes typically adhere to components of the dispersion remaining on the surface, such as surface-actives substances, after a drying of the dispersion. The substrate can in particular be used as an electrode for this purpose and the electrical field between the substrate and an electrode disposed opposite the substrate can support the growth of the carbon nanotubes along the field lines. The fragments are, however, also already correspondingly oriented during the application onto the substrate by the electrical field so that the surface is intersected by the longitudinal axis of the fragments and the fragments are not oriented in parallel in a plane with respect to the carrier.

Alternatively or additionally, the fragments can be oriented by a self-organization on a gold layer applied to the surface of the carrier. $SH(CH_2)_nNH_2$ molecules, e.g. cysteamines, are preferably used for this purpose that provide a vertical orientation of the carbon nanotubes. The described self-organization can also be combined with the previously described orientation by means of the electrical field.

A surface density of the fragments can be monitored on the application and orientation of the fragments via the concentration of the fragments in the dispersion, i.e. the higher the proportion of the fragments, the larger the surface density, that is the number of fragments per unit of area, also is. The fragments can, for example, be applied by dipping the carrier into the dispersion, with a drying of the carrier together with the coating subsequently taking place so that the fragments ultimately adhere to a dry surface.

The carrier can be a silicon oxide substrate or a glass substrate since such carriers are frequently used in microtechnology and nanotechnology, are thermally stable at temperatures up to 1200° C., and are simple to handle.

The longitudinal axis of the fragments applied to the carrier typically has an angle with respect to the surface of between 60° and 120°, preferably between 75° and 105°, particularly preferably between 80° and 100°. The longitudinal axis along which the carbon nanotubes are extended is therefore as parallel as possible with a surface normal of the surface of the carrier. Only a specific percentage of the growing carbon nanotubes, typically 60%, preferably 75%, and particularly preferably 90%, can, also have this angle. The carrier itself can be a planar carrier, i.e. the surface on which the fragments are deposited is planar.

To extend or to grow the carbon nanotubes, plasma-assisted chemical vapor deposition can be used since an improved growth can hereby be achieved.

Provision can be made that the dispersion is formed from water, preferably from distilled water, and from a surface-active substance, preferably a surfactant, to generate a homogeneous dispersion that allows a uniform coverage of the surface of the carrier. Sodium dodecyl sulfate (SDS) or sodium dodecyl benzenesulfonate (SDBS) can be used as the surfactant. The surfactant preferably also serves as a binding agent and as a fixing means; dried residues of the surfactant can in particular be used for binding and fixing the oriented fragments.

The surface-active substance is typically present in the dispersion in a concentration of between 0.02 wt. % and 2 wt. %, preferably less than 1 wt. %. In addition, however, isopropanol or ethanol can also be added to the dispersion of distilled water, the surface-active substance and the at least one carbon nanotube.

A surfactant layer typically forms on the carrier on the drying of the dispersion mixed with the surfactant and the fragments of the carbon nanotubes are applied to the surfactant layer and are oriented. The concentration of the surfactants in the dispersion is selected in this respect such that a desired thickness of the surfactant layer is adopted, with the thickness of the surfactant layer per surface unit likewise being increased with a higher proportion.

Particles that are not fragments are typically removed from the dispersion after the generation of the fragments. This preferably takes place by ultracentrifugation or by another of the already named techniques. A high quality of the deposited fragments without interfering foreign bodies is hereby ensured.

The generated carbon nanotubes having the same electronic properties can be removed from the carrier material and can serve as a starting material for a further carrying out of the method. A yield of carbon nanotubes having the same electronic properties can hereby be increased in a cascading manner. This allows a scaling up of the method, with a degree of purity, that is a proportion of manufactured carbon nanotubes having identical physical properties, being able to be systematically increased with every carrying out.

After the growing by chemical vapor deposition, the reproduced carbon nanotubes can be measured with respect to their properties. This preferably takes place by optical absorption spectroscopy, Raman spectroscopy and/or by a photoluminescence measurement. Carbon nanotubes that differ from the desired properties are then separated from the remaining carbon nanotubes having the same electronic properties. The separation can in turn take place by means of centrifugation, in particular ultracentrifugation, chromatography or a technique based on gel or polymers. Dirt particles that have been produced on the generation of the fragments can also be removed from the dispersion by centrifugation in a method step in that the dispersion is centrifuged at different accelerations.

A packing density of the carbon nanotubes manufactured on the carrier using the described method can amount to up to 10,000 per $\mu m^2$, preferably up to 20,000 carbon nanotubes per $\mu m^2$, particularly preferably up to 40,000 carbon nanotubes per $\mu m^2$. A spacing of the carbon nanotubes from one another on the carrier or a spacing of the fragments from one another on the carrier is typically less than 0.5 $\mu m$.

Even if the fragments are formed from carbon nanotubes, nanotubes of boron nitride, boron or silicon can also grow at the fragments alternatively to the carbon nanotubes. For this purpose, the growth takes place correspondingly in an atmosphere containing boron, silicon and/or nitrogen in the apparatus for chemical vapor deposition. It is also possible to grow doped carbon nanotubes in which different atoms are therefore inserted into a frame of the nanotube at different sites of carbon atoms. Corresponding impurity atoms are in this respect provided in the apparatus for chemical vapor deposition during the growth of the nanotubes.

A carrier can be manufactured, typically using the described method and having single-walled carbon nanotubes of the same diameter and of the same chirality arranged on a surface of the carrier, in which the carbon nanotubes are arranged on the surface such that a longitudinal axis of the carbon nanotubes intersects the surface and the carbon nanotubes are not oriented in parallel in a plane with respect to the carrier. A carrier is thus present having carbon nanotubes oriented vertically with respect to the carrier and applied to the carrier and that is able to be installed in components.

In addition, a carrier can be manufactured, preferably using the described method, having fragments arranged on and oriented on the carrier, but having carbon nanotubes not yet growing or already grown thereon. The carrier is thus typically present in the state in which it is introduced into the apparatus for chemical vapor deposition in accordance with the method already described. A carrier prepared in this manner can be stored and can be further processed later.

Provision can be made that a surfactant layer deposited from the dispersion mixed with the surfactants is present on the carrier after the drying. The fragments are arranged on this surfactant layer and their orientation is stabilized by the surfactant layer.

This surfactant layer can have a thickness that is smaller than a length of the fragments. This thickness typically amounts to between 0.3 μm and 1 μm, preferably between 0.5 μm and 0.8 μm. The fragments can hereby, on the one hand, reliably adhere to the surfactant layer without a subsequent growth being impeded.

A surface of the carrier on which the fragments are oriented can be completely covered by the surfactant layer after the removal of the carrier from the dispersion and after the drying of the carrier in order to allow an adhesive bonding of the fragments over a surface that is as large as possible.

Instead of the surfactants, the surface of the carrier can also be provided with a gold layer on which the fragments are applied and oriented, with the surface preferably being provided with a layer of $SH(CH_2)_n NH_2$ molecules for orienting the surface.

Embodiments of the invention are shown in the drawings and will be explained in the following with reference to FIGS. 1 to 8.

Figure 2:
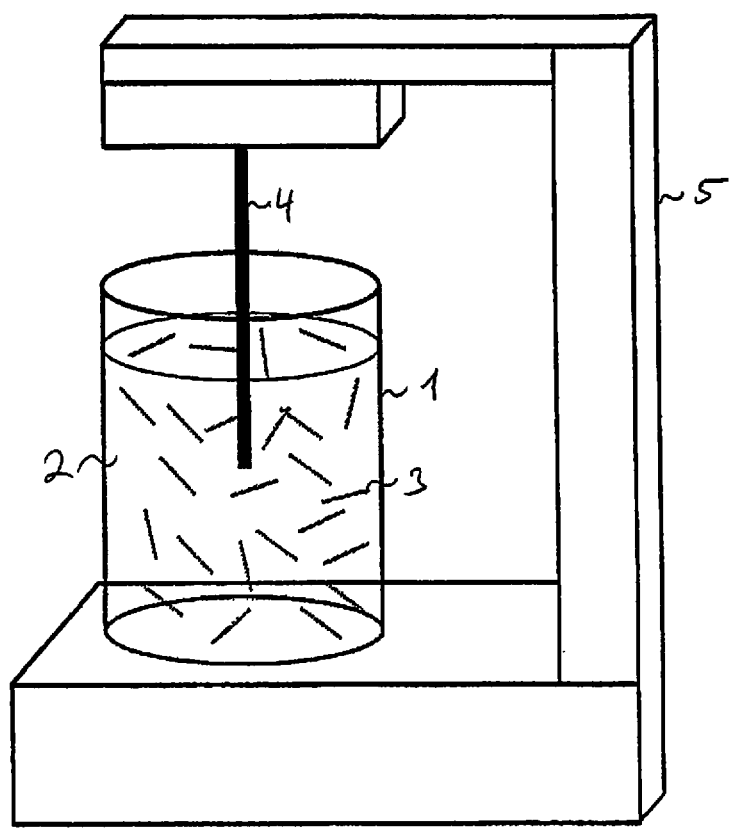
Figure 3:
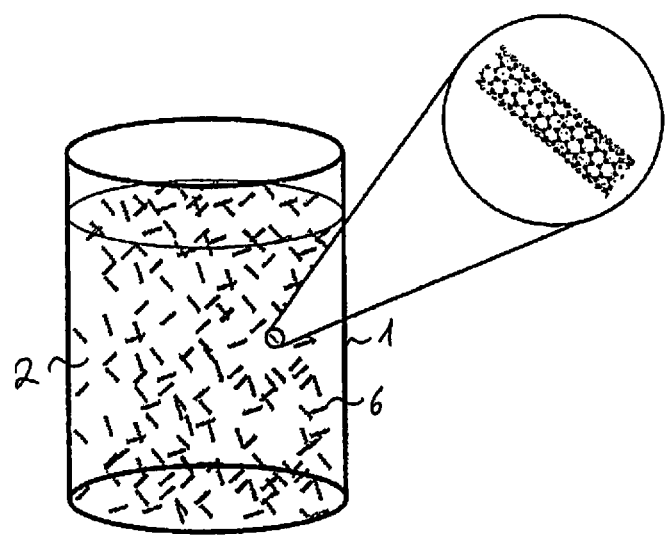
Figure 4:
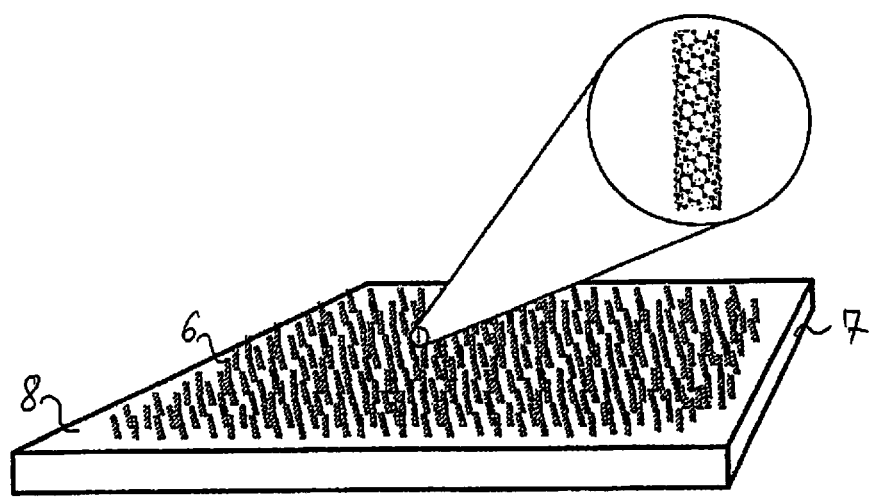
Figure 5:
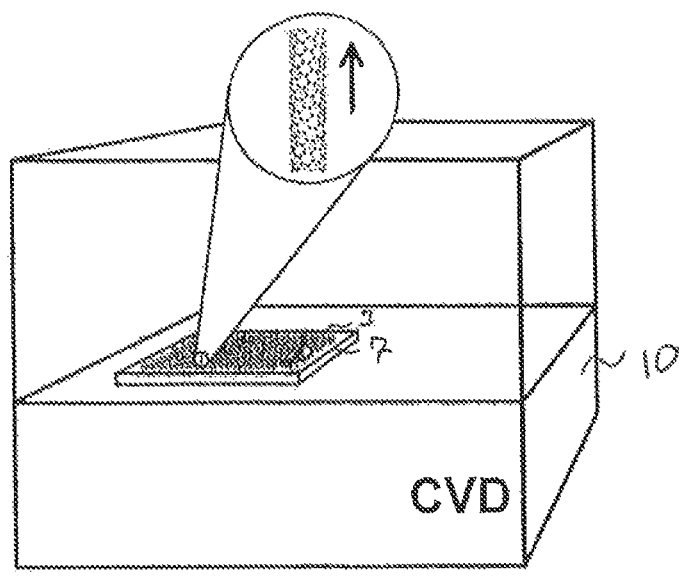
Figure 6:
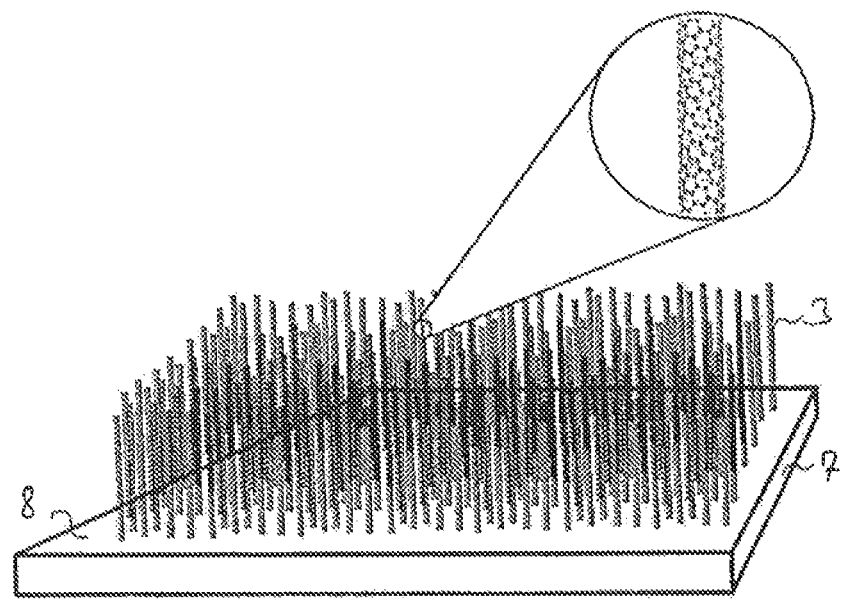
Figure 7:
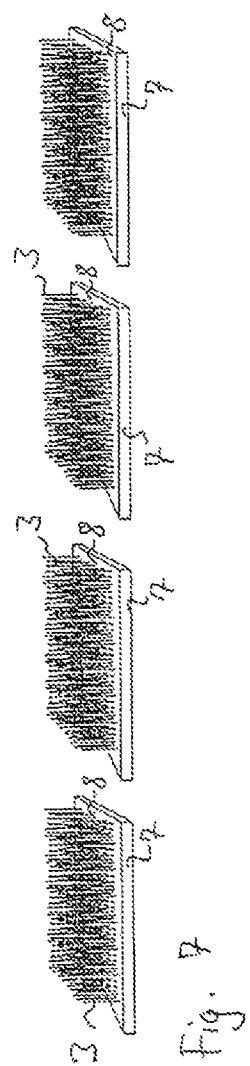
Figure 8:
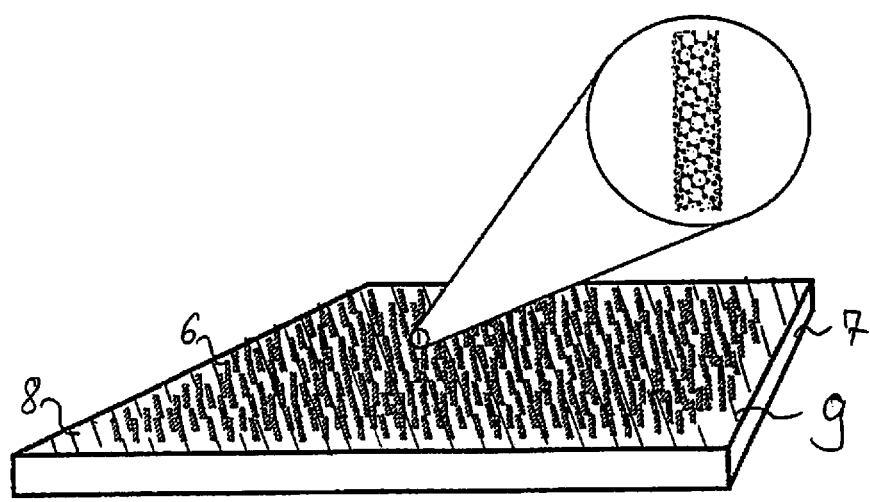

There are shown:

FIG. 1 a dispersion of a liquid and single-walled carbon nanotubes contained in a vessel shown in a perspective view;

FIG. 2 an ultrasound treatment of the dispersion shown in FIG. 1 in a view corresponding to FIG. 1;

FIG. 3 the fragments of the carbon nanotubes obtained in the ultrasound treatment shown in FIG. 2 in a view corresponding to FIG. 1;

FIG. 4 the fragments deposited from the dispersion on a surface of a carrier in a perspective view;

FIG. 5 a reactor for chemical vapor deposition in a perspective view in which reactor the carrier shown in FIG. 4 has been introduced, FIG. 6 a view of the carrier corresponding to FIG. 4 with the extended, vertically oriented carbon nanotubes;

FIG. 7 a plurality of the carriers shown in FIG. 6 with carbon nanotubes arranged thereon, and FIG. 8 a view of the carrier corresponding to FIG. 4 with a surfactant layer and with carbon nanotubes applied thereto.

A vessel 1 is shown in FIG. 1 in which a homogeneous dispersion 2 of a liquid having a surfactant and a plurality of carbon nanotubes 3 is contained. In further embodiments, only a single carbon nanotube having predefined electronic properties can also be taken as the starting material for the method. The liquid in the embodiment shown is distilled water; deionized water can, however, also generally be used. The surfactant, sodium dodecyl sulfate, SDS, in the embodiment shown, is present in the dispersion in a concentration of 0.1 wt. %. In addition, isopropanol has been admixed in the dispersion, but this can also be dispensed with in further embodiments. One of the carbon nanotubes 3 is shown in an enlarged representation by way of example. At least 90% of the carbon nanotubes 3 contained in the dispersion 2 have the same electronic properties, are therefore semiconductive in the embodiment shown, and preferably have a diameter of the same size and an identical chirality. In addition, the carbon nanotubes 3 are all single-walled. In further embodiments, the carbon nanotubes 3 can, however, also be metallic. It is avoided by the addition of surfactants that the carbon nanotubes 3 are attached to one another and form bundles, but are rather present evenly distributed in the dispersion 2. In further embodiments, the carbon nanotubes 3 can also be oxidized by an acid and can thus be hydrophilic instead of hydrophobic; or organic solutions such as dimethylformamide (DMF) are used for producing a homogeneous dispersion. The carbon nanotubes 3 having identical physical properties were produced using a method known from the prior art in the example shown and were subsequently sorted. In the embodiment shown, 99% of the carbon nanotubes 3 used for the dispersion 2 have identical properties.

To reproduce the carbon nanotubes 3 contained in the dispersion 2, a breaking of the carbon nanotubes 3 into smaller fragments is effected by the effect of ultrasound in the vessel 1 having the dispersion 2 of the carbon nanotubes 3. Repeating elements are provided with identical reference numerals in this Figure and also in the following Figures. To produce the fragments, a tip 4 of an ultrasound sonicator is introduced into the dispersion 2 and ultrasound of a frequency of 30 kHz and at a power of 30 W to 100 W is introduced into the dispersion 2 via the ultrasound device 5.

The vessel 1 with the dispersion 2 and the produced fragments 6 is shown in FIG. 3. The fragments 6 have a length of 30 nm to 100 nm with a diameter of approximately 1 nm. Since further particles such as bundles of carbon nanotubes 3, amorphous carbon or residues of catalysts can also have formed due to the ultrasound input, these particles can be removed from the dispersion 2 in a further method step by centrifugation; for example, the dispersion 2 is centrifuged for 8 hours at 20,000 times gravitational acceleration, that is at 20,000 g.

The dispersion 2 shown in FIG. 3 is applied to a planar carrier 7 by a pipette, for example, and the liquid is removed, for example by heating. The planar carrier 7 is a silicon wafer that is introduced into an electrical field during or after the drying for the removal of liquid components of the dispersion 2 and also withstands a subsequent further treatment without damage due to its temperature resistance up to 1200° C. Field lines of the electrical field in this respect stand perpendicular on a planar surface 8 of the carrier 7 so that the fragments 6 are oriented in parallel with the field lines on the surface 8, that is a longitudinal axis of the fragments 6 is likewise at a right angle to the surface 8. A layer is thus produced of fragments 6 oriented vertically on the carrier 7. It may, however, also occur that only a certain percentage of the fragments 6 have the same orientation. For example, in the embodiment shown, 80% of the fragments 6 are oriented in parallel with a surface normal, whereas the remainder has an angular offset of up to 20° from the surface normal.

In a further embodiment, a gold layer is applied areally to the surface 8 and the fragments 6 are oriented on said gold layer by self-organization assisted by cysteamines, namely $SH(CH_2)_2 NH_2$, such that the longitudinal axis intersects the surface 8, that is the fragments 6 stand at a right angle on the surface 8. The application of the dispersion 2 onto the carrier takes place by dipping the carrier 7 into the dispersion. The cysteamines used are in this respect contained in the dispersion 2 or are applied to the gold layer in a preceding method step, for example by dipping into a liquid mixed with the cysteamines.

The carrier 7 prepared in this manner having the fragments 6 of the single-walled carbon nanotubes having the same electronic properties oriented on the surface 8 can be temporarily stored in this form and can only subsequently be further processed in a further step.

The carrier 7 shown in FIG. 4 having fragments 6 of the single-walled carbon nanotubes 3 having the same electronic properties oriented on the surface 8 is introduced, as shown in FIG. 5, into a reactor 10 that is suitable for chemical vapor deposition (CVD). In this reactor 10, tips of the fragments 6 are first chemically activated in an atmosphere containing hydrogen and carbon nanotubes 3 having the same electronic properties and, provided that carbon nanotubes 3 having the same diameter and the same chirality were used as the starting material, also having the same diameter and the same chirality, are then grown epitaxially by chemical vapor deposition, starting from the fragments 6, in an atmosphere containing carbon until the desired length is reached. In further embodiments, plasma-assisted chemical gas vapor deposition can also be used for this purpose. The atomic structure of the fragments 6, that is in particular their diameter and their chirality, is not changed by the epitaxial growth. In addition, doped carbon nanotubes, boron nitride nanotubes, boron nanotubes or silicon nanotubes can also be grown in a corresponding atmosphere.

After the end of the chemical vapor deposition, the carbon nanotubes 3 are grown on the surface 8 of the carrier 7, starting from the fragments 6 used as the starting layer, as shown in FIG. 6. These carbon nanotubes in the embodiment shown are single-walled, semiconductive, and typically have the same respective diameter and the same chirality when carbon nanotubes having the same diameter and the same chirality were used as the starting material. In addition, they are all arranged vertically to the surface 8, i.e. are grown along a longitudinal axis of the fragments 6 and form a layer of vertically arranged carbon nanotubes 3. A packing density amounts in the embodiment shown to 10,000 carbon nanotubes per $\mu m^2$, while a spacing of the carbon nanotubes from one another is smaller than 0.5 $\mu m$.

Provision can be made in further embodiments that the grown carbon nanotubes 3 are measured by Raman spectroscopy or by another measuring process with respect to their electrical and optical properties. Carbon nanotubes 3 whose physical properties differ from the majority can subsequently be removed from the bundle of obtained carbon nanotubes 3, for example by ultracentrifugation, chromatography or a process based on gels or polymers.

The carbon nanotubes 3 can be removed from the carrier 7 and can be installed in applications, for example in transistors, for example field effect transistors, or in other components such as sensors, photon detectors, optical modulators, light sources, solar cells or thermoelectric components.

Alternatively, the carbon nanotubes 3 can be removed from the carrier 7 and a further dispersion 2 can be formed, as shown in FIG. 1. The method can then be repeated for the cascading reproduction of the carbon nanotubes 3, that is fragments 6 can likewise be produced by ultrasound and these fragments 6 can be deposited and extended on a further carrier 7. The configuration shown in FIG. 7 hereby results of a plurality of carriers 7 on which respective carbon nanotubes 3 having defined physical properties are deposited.

FIG. 8 shows in a view corresponding to FIG. 4 the carrier 7 having a surfactant layer 9 of SDS that is deposited on, that is shown hatched, that has a thickness of 200 nm and that, as an intermediate layer, covers a surface 8 of the carrier 7 on which the fragments 6 are deposited completely, that is without cut-outs or holes. The fragments 6 have a length that is larger than the thickness of the surfactant layer 9 so that the fragments 6 are deposited and are oriented on the surfactant layer 9 and are stabilized in their orientation by the dried surfactant layer 9.

Features of the different embodiment only disclosed in the embodiment examples can be combined with one another and claimed individually.

The invention claimed is:

1. A method of reproducing at least one single-walled carbon nanotube having predefined electronic properties selected from the group consisting of a single-walled carbon nanotube having predefined electronic properties and a plurality of single-walled carbon nanotubes having the same predefined electronic properties, the method comprising the steps:
    a) preparing a dispersion from a liquid and from the at least one single-walled carbon nanotube having predefined electronic properties;
    b) forming fragments of the at least one single-walled carbon nanotube having predefined electronic properties by an energy input into the dispersion;
    c) applying the fragments from the dispersion onto a surface of a carrier selected from the group consisting of silicon oxide or glass as a starting layer for reproducing the nanotubes and, prior to nanotube reproducing, orienting the fragments on the surface during the application from the dispersion so that the surface is intersected by a longitudinal axis of the fragments and the fragments are not oriented in parallel in a plane with respect to the surface of the carrier, wherein the fragments are oriented on the surface prior to nanotube reproducing by applying and drying on the surface, under application of an electric field, a surfactant layer containing the fragments, which is formed by a surfactant comprised in the dispersion, the surfactant layer having a thickness that is less than a length of the fragments,
    such that the surfactant layer after drying completely covers the surface of the carrier, so that the fragments of the at least one single-walled carbon nanotube are applied and oriented on as well as fixed to the carrier via the surfactant layer; and
    d) introducing the fragments applied to, fixed, and oriented on the carrier such that the surface is intersected by a longitudinal axis of the fragments and the fragments are not oriented in parallel in a plane with respect to the surface of the carrier into an apparatus for chemical vapor deposition, chemically activating tips of the fragments by exposure to an atmosphere containing hydrogen, and then epitaxially growing single-walled carbon nanotubes having the same predefined electronic properties as the at least one single-walled carbon nanotube by the fragments being extended in the apparatus using chemical vapor deposition in a gas atmosphere containing carbon.

2. A method in accordance with claim 1, characterized in that the fragments are formed by introduction of ultrasound into the dispersion, with fragments having a length between 30 nm and 100 nm being obtained.

3. A method in accordance with claim 2, characterized in that ultrasound is used having a power of 30 W to 100 W at a frequency between 20 kHz and 40 kHz.

4. A method in accordance with claim 1, characterized in that the longitudinal axis of the applied fragments has an angle with respect to the surface between 60° and 120°, with the carrier being a silicon oxide substrate.

5. A method in accordance with claim 1, characterized in that plasma-assisted chemical vapor deposition is used to extend the carbon nanotubes.

6. A method in accordance with claim 1, characterized in that the carbon nanotubes used for reproduction have the same diameter and the same chirality.

7. A method in accordance with claim 1, characterized in that the dispersion is prepared from water, and from a surfactant, for producing a homogeneous dispersion.

8. A method in accordance with claim 1, characterized in that the produced carbon nanotubes having the same electronic properties are removed from the carrier and the method is carried out again using these removed carbon nanotubes for a further reproduction of the carbon nanotubes.

9. A method in accordance with claim 1, characterized in that the single-walled carbon nanotubes are formed with a diameter between 0.6 nm and 2 nm.

10. A method in accordance with claim 1, characterized in that the reproduced carbon nanotubes are measured with respect to their properties by optical absorption spectroscopy, Raman spectroscopy and/or a photoluminescence measurement after the growing by chemical vapor deposition and carbon nanotubes differing from the desired properties are separated.

11. A method in accordance with claim 1, characterized in that the carbon nanotubes and/or the fragments of the carbon nanotubes are arranged on the carrier with a spacing from one another of less than 0.5 µm.

12. The method in accordance with claim 1, wherein the fragments have a length between 30 nm and 100 nm and a diameter between 0.6 nm and 2 nm.

13. The method in accordance with claim 12, wherein the at least one single-walled carbon nanotube is exclusively semiconductive or exclusively metallic.

14. The method of claim 1 wherein the single-walled carbon nanotubes are grown in the absence of an electric field.

15. The method of claim 12 wherein the single-walled carbon nanotubes are grown in the absence of an electric field.

* * * * *